United States Patent
Wang et al.

(10) Patent No.: US 7,767,471 B2
(45) Date of Patent: Aug. 3, 2010

(54) AUTO ROUTING FOR OPTIMAL UNIFORMITY CONTROL

(75) Inventors: Jean Wang, Hsin-Chu (TW); Francis Ko, Taichung (TW); Henry Lo, Hsiu-Chu (TW); Chi-Chun Hsieh, Tongluo (TW); Amy Wang, Taipei (TW); Chih-Wei Lai, Hsin-Chu (TW); Chun-Hsien Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 210 days.

(21) Appl. No.: 11/830,519

(22) Filed: Jul. 30, 2007

(65) Prior Publication Data

US 2009/0035883 A1 Feb. 5, 2009

(51) Int. Cl.
*H01L 21/00* (2006.01)
*G01R 31/26* (2006.01)
(52) U.S. Cl. .............. 438/5; 438/16; 438/17; 700/121
(58) Field of Classification Search .......... 438/16, 438/17, 5; 356/394; 700/121
See application file for complete search history.

(56) References Cited

U.S. PATENT DOCUMENTS

| 6,751,518 | B1 * | 6/2004 | Sonderman et al. | 700/121 |
| 7,051,250 | B1 * | 5/2006 | Allen et al. | 714/708 |
| 2002/0087229 | A1 * | 7/2002 | Pasadyn et al. | 700/121 |
| 2005/0014299 | A1 * | 1/2005 | Yang et al. | 438/16 |

* cited by examiner

*Primary Examiner*—Kiesha R Bryant
*Assistant Examiner*—Mark W Tornow
(74) *Attorney, Agent, or Firm*—Slater & Matsil, L.L.P.

(57) ABSTRACT

A method for improving within-wafer uniformity is provided. The method includes forming an electrical component by a first process step and a second process step, wherein the electrical component has a target electrical parameter. The method includes providing a first plurality of production tools for performing the first process step; providing a second plurality of production tools for performing the second process step; providing a wafer; performing the first process step on the wafer using one of the first plurality of production tools; and selecting a first route including a first production tool from the second plurality of production tools. A within-wafer uniformity of the target electrical parameter on the wafer manufactured by the first route is greater than a second route including a second production tool in the second plurality of production tools.

15 Claims, 3 Drawing Sheets

AUTO ROUTING FOR OPTIMAL UNIFORMITY CONTROL

TECHNICAL FIELD

This invention relates generally to integrated circuits, and more particularly to within-wafer uniformity control in the formation of integrated circuits.

BACKGROUND

Modern integrated circuits are formed by many, often hundreds of, process steps. The formation of each component in the integrated circuit may involve several process steps. For each of the process steps, there is often a plurality of identical production tools for performing the same task in order to improve throughput. However, each wafer is processed by only one of the production tools for one process step.

Currently, the decision as to which production tool a wafer will be sent to is made by a dispatching system. The existing dispatching system primarily makes the dispatching decision based on the production efficiency. For example, a wafer will be typically sent to a production tool that has finished preparation steps, such as pre-heating, and is ready for performing the task. Also, the dispatching system may determine the queuing time of each of the production tools, and send the wafer to the production tool with the shortest queuing time.

Alternatively, a wafer may be dispatched to a production tool having a higher production yield than others. Some production tools, for example, chemical mechanical polishing tools, may generate higher process variations than others. These higher process variations may cause circuit failure for some very small-scale integrated circuits, and yields of production tools may be noticeably different from each other.

The existing dispatching system, however, does not take the within-wafer uniformity of the integrated circuits into account. For high performance integrated circuits, the within-wafer uniformity of the integrated circuits has become an important issue for the stability of integrated circuits. Furthermore, with the down-scaling of integrated circuits, small variations in a physical characteristic may result in a significant variation in electrical performance. New methods for improving the within-wafer uniformity of integrated circuits are thus needed.

SUMMARY OF THE INVENTION

In accordance with one aspect of the present invention, a method for improving within-wafer uniformity is provided. The method includes forming an electrical component by a first process step and a second process step, wherein the electrical component has a target electrical parameter. The method includes providing a first plurality of production tools for performing the first process step; providing a second plurality of production tools for performing the second process step; providing a wafer; performing the first process step on the wafer using one of the first plurality of production tools; and selecting a first route including a first production tool from the second plurality of production tools. A within-wafer uniformity of the target electrical parameter on the wafer manufactured by the first route is greater than a second route including a second production tool in the second plurality of production tools.

In accordance with another aspect of the present invention, a method of forming an integrated circuit includes providing a wafer; performing a first process step on the wafer; after the first process step, determining a first non-uniformity of integrated circuit components on the wafer; predicting uniformity profiles of a plurality of production tools for performing a second process step, wherein combinations of the first non-uniformity and the plurality of production tools affect a target electrical parameter of target components on the wafer; selecting a production tool from the plurality of production tools according to the uniformity profiles, wherein the production tool has a uniformity profile matching the first non-uniformity; and dispatching the wafer to the production tool.

In accordance with yet another aspect of the present invention, a method of forming metal lines includes providing a plurality of etchers; providing a plurality of chemical mechanical polish (CMP) tools; providing a wafer; etching the wafer to form trenches; measuring dimensions of the trenches at a plurality of points on the wafer to determine a non-uniformity of trench depths; filling the trenches with a metal-containing material; determining uniformity profiles of the CMP tools; and selecting a CMP tool from the plurality of CMP tools and performing a CMP using the CMP tool to form metal lines, wherein the CMP tool has a uniformity profile matching the non-uniformity of the trenches.

By matching uniformity profiles of the production tools for the second process step, the within-wafer non-uniformity caused by the first process step is at least partially compensated for. The within-wafer uniformity can thus be improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

As is known in the art, a wafer typically includes a plurality of semiconductor chips (also referred to dies in the art) having identical integrated circuit design. However, from chip to chip, the physical and electrical characteristics of integrated circuits may vary, and the variations are often referred to as within-wafer (WiW) uniformity or WiW uniformity variations. A wafer having a high WiW uniformity value or a low WiW uniformity variation means that the semiconductor chips on the wafer have a higher degree of similarity.

A component in an integrated circuit on a wafer may be formed by several process steps, each being performed by a production tool. Some or all of these process steps may affect the WiW uniformity of a target electrical performance of identical components on different semiconductor chips. The embodiments of the present invention provide a method to improve the WiW uniformity using the interaction between the process steps. To explain the concept of the present invention, the WiW uniformity of resistivity (RsU) of copper lines is used as an example. It is noted that the concept of the present invention is readily applicable on the improvement in the electrical parameter of other features, such as drive current WiW uniformity (IdU).

Figure 1:
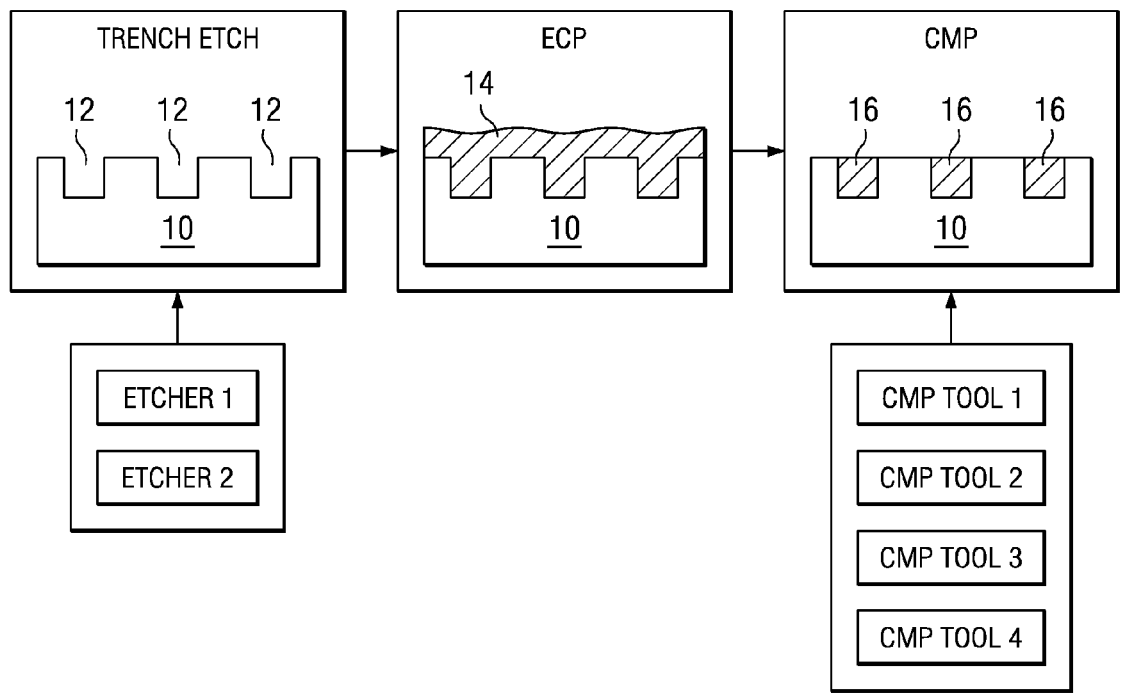
FIG. 1 schematically illustrates an exemplary copper line formation process.

FIG. 1 illustrates an exemplary process for forming copper lines. The production of the copper lines in wafer 10 involves the steps of forming trenches 12 in wafer 10, filling trenches 12 with copper 14, and performing chemical mechanical polish (CMP) to form copper lines 16. The task of forming the trenches is shared by two etchers, namely etcher 1 and etcher 2. The task of CMP is shared by four CMP tools, namely CMP tool 1, CMP tool 2, CMP tool 3 and CMP tool 4. Each sample wafer goes through a route including one of the etchers 1 and 2 and one of the CMP tools 1 through 4.

Figure 2:
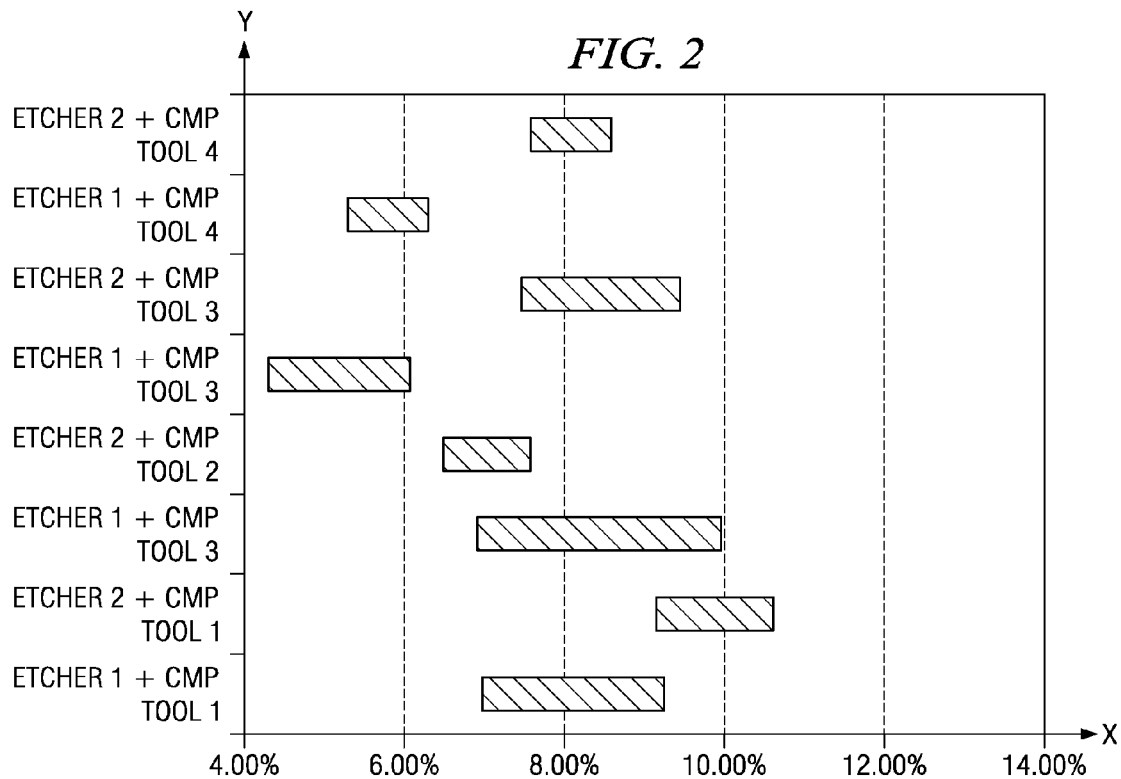
FIG. 2 illustrates experiment results showing the effect of different routes to the within-wafer uniformity variations in the copper line formation process.

FIG. 2 illustrates an experiment's result showing the WiW RsU variation of a plurality of wafers, wherein the sample wafers have copper lines as shown in FIG. 1 formed therein, and the WiW RsU are the uniformity of the copper lines. The Y-axis represents all combinations of possible routes, and the X-axis represents the statistical range of the WiW RsU uniformity variation of the wafers that went through different routes. The WiW RsU uniformity variation of the sample wafers is measured after the formation of copper lines 16 (refer to FIG. 1).

The results shown in FIG. 2 illustrate that the routes of the wafers affect the WiW RsU uniformity variations of the wafers. For example, wafers that went through a route including etcher 1 and CMP tool 3 had a RsU uniformity variation range of between 4 percent and about 6 percent, while wafers that went through a route including etcher 2 and CMP tool 1 had a RsU uniformity variation range of between 9 percent and about 11 percent. The average RsU uniformity variations of some routes may thus double the values of others. It is perceived that both etchers and CMP tools may generate non-uniformities. In some of the production routes, the non-uniformities of the respective etcher and the respective CMP tool compensate for each other. In other words, the non-uniformities of the respective etcher and the respective CMP tool at least partially cancel each other, and hence the thicknesses of the resulting metal lines on a wafer are more uniform. Accordingly, the WiW RsU (of the copper lines) of the wafer is improved. In other production routes, the non-uniformities of the respective etcher and the respective CMP tools are added together, causing an even greater non-uniformity in the WiW resistivity. The following discussed embodiments of the present invention provide a method for selecting an optimum route, so that the non-uniformity of the production tools can compensate for each other, and the resulting physical characteristics and/or electrical performances have optimum WiW uniformities.

Figure 3:
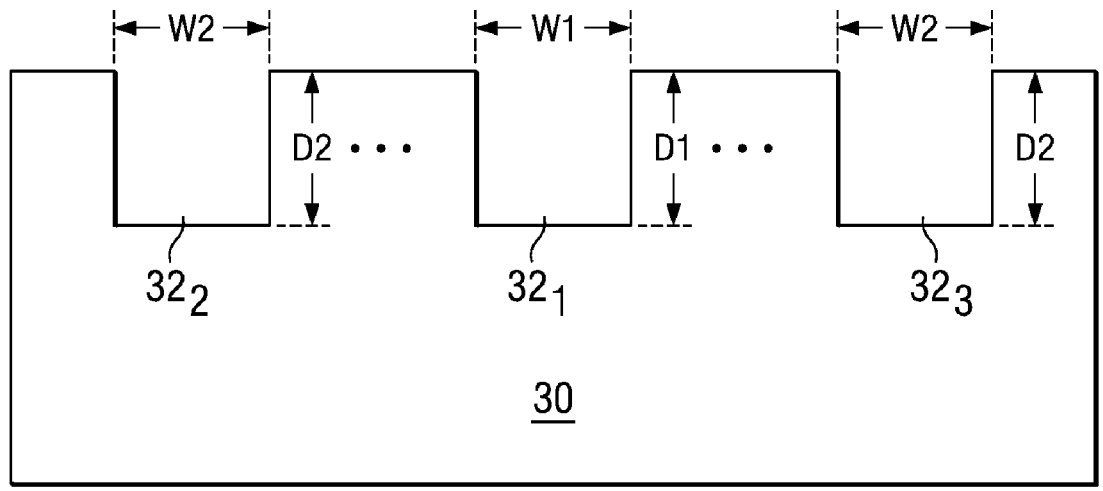
FIG. 3 illustrates trenches formed on a wafer, wherein the trenches formed at different points of the wafer have different widths and depths.

Referring to FIG. 3, in an embodiment of the present invention, wafer 30 is etched by one of the etchers, forming trenches 32 including trench $32_1$ at the center of wafer 32, and trenches $32_2$, and $32_3$ in semiconductor chips close to the edges of wafer 30. An after-etching inspection (AEI) is then performed on wafer 30 to estimate the widths W (including W1 and W2) and depths D (including D1 and D2) of trenches 32. Typically, the estimation includes measuring the widths W and depths D of trenches at a limited number of selected points (locations) scattered on wafer 30. In an exemplary embodiment, nine points are selected. The selected points are preferably identical positions of different chips. Accordingly, the uniformities of the widths W and depths D of trenches 32 are obtained. FIG. 3 schematically illustrates three of the measured points. In the discussed exemplary embodiment, the trench formation causes a first non-uniformity. Accordingly, trench depth D1 at point $32_1$ is different from the trench depth D2 at points $32_2$ and $32_3$, and the width W1 at point $32_1$ is different from the width W2 at points $32_2$ and $32_3$. The first non-uniformity is collected by a dispatching system.

To compensate for the first non-uniformity, an appropriate CMP tool is needed. Accordingly, CMP tools 1 through 4 are evaluated. The evaluation of CMP tools 1 through 4 are performed by performing a CMP on a wafer for each of the CMP tools 1 through 4, and then measuring the polish rates at the same locations (for example, the same nine points) as shown in FIG. 3. The polish rates at the nine points are used to construe a uniformity profile of the respective CMP tool. Typically, integrated circuit manufacturing tools vary in performance, although they are made to be identical. CMP tools 1 through 4 will also have different CMP profiles.

It is realized that the CMP profile of each of the CMP tools may vary with time. Accordingly, the evaluation of the CMP tools 1 through 4 is preferably performed from time to time. In an embodiment, the uniformity profile evaluation of the CMP tools is performed in real-time, wherein after a wafer is polished, an after-polish inspection (API) is performed to measure the dimensions, including the depths D of copper lines 34 (refer to FIG. 4), to obtain the CMP profiles of the CMP tool for polishing the wafer. The real-time measured CMP profiles can be used for the manufacturing of the subsequent wafers. In other embodiments, the CMP profile evaluation may be preformed periodically. The optimum period depends partially on the stability of the CMP profiles, and the more stable the CMP profiles are, the longer the period can be. In an exemplary embodiment, the evaluation of the CMP profiles is performed daily or semi-daily.

Figure 4:
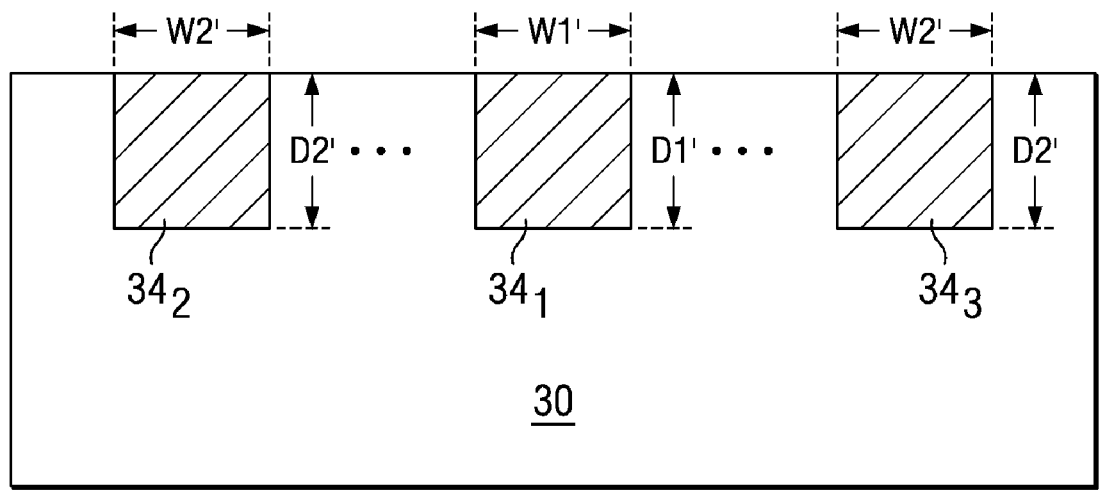
FIG. 4 illustrates copper lines formed on a wafer, wherein the copper lines formed at different points of the wafer have different widths and thicknesses.

Knowing the first non-uniformity of wafer 30 after the step of forming trenches 32 (refer to FIG. 3), the dispatching system selects the best route, and dispatches wafer 30 to a CMP tool having a uniformity profile matching the first non-uniformity. The selected CMP tool will almost inevitably create a second non-uniformity during the CMP step. Throughout the description, when a uniformity profile of a manufacturing tool is referred to as "matching" the first non-uniformity, it means that uniformity profile has a net effect of canceling the first non-uniformity, so that the resulting uniformity of the target electrical parameter (for example, the RsU) is improved. In the resulting structure as shown in FIG. 4, the second non-uniformity of the selected CMP tool compensates for the first non-uniformity, and hence the resulting metal lines 34 throughout the wafer 30, which metal lines 34 include the illustrated metal lines $34_1$, $34_2$, and $34_3$, have an optimum WiW RsU uniformity. In an embodiment, the dispatching system may determine a target non-uniform that may totally cancel the first non-uniformity, and selecting the CMP tool having a uniformity profile best matching the target non-uniformity. For example, if the AEI results of a wafer reveal that depth D1 is greater than depths D2 (refer to FIG. 3), the dispatching system will try to select one of the CMP tools 1 through 4 that has a greater polish rate at the center of wafers than at edge regions. Conversely, if the AEI results reveal that depth D1 is less than depths D2 (refer to FIG. 3), the dispatching system will try to select one of the CMP tools 1 through 4 that has lower polish rate at the center of wafers than at the edge regions.

The dispatching system may also set up a priority list, which lists the order of CMP tools according to the degrees of matching between the uniformity profiles of the CMP tools and the first non-uniformity, from the best to the worst. The dispatching system may combine other criteria with the WiW uniformity requirement to determine preferred routes. In an embodiment, the dispatching system queries the queuing time of each of the CMP tools 1 through 4, and will try to dispatch wafer 30 to the best matching CMP tool. If the best matching CMP tool has a longer queuing time than other CMP tools, wafer 30 may be dispatched to the second best matching CMP tool, or other CMP tools accordingly to the priority list.

Advantageously, the embodiments of the present invention have the ability of routing wafers in real-time to the best routes based on the uniformity of trenches. The priority list further makes it possible for improving the target electrical parameter of the wafers without sacrificing the throughput.

Figure 5:
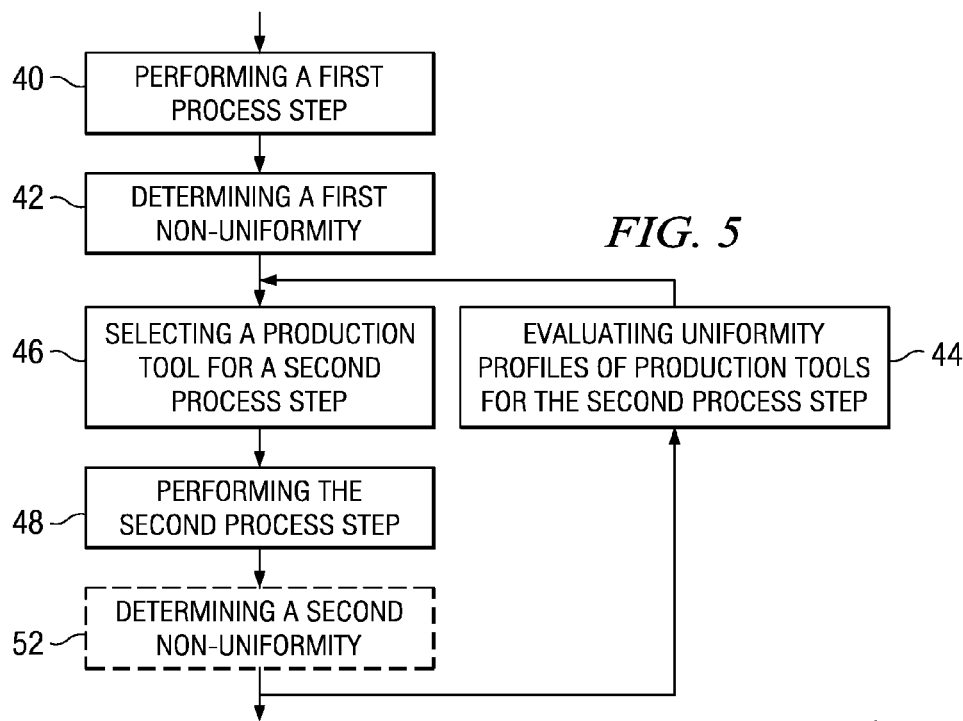
FIG. 5 illustrates a flowchart of an embodiment of the present invention, wherein an electrical parameter of a component in an integrated circuit is affected by two process steps.

Generally, the method discussed in the preceding embodiment may be discussed using the flowchart shown in FIG. 5, which shows the steps for optimizing a uniformity of a target electrical parameter of a component, whose formation includes two uniformity-affecting process steps. Referring to FIG. 5, a first process step for forming the component is performed on a wafer (step 40). The wafer is then measured to obtain a first non-uniformity that will affect the target electrical parameter (step 42). The uniformity profiles of all production tools for performing the second process step are also evaluated (predicted, step 44). Step 44 may be performed using the data obtained from previously processed wafers, or, by evaluating sample wafers periodically, wherein the sample wafers are specifically designated for evaluating the production tools. A production tool having a uniformity profile matching the first non-uniformity is then selected (step 46), and the wafer is dispatched to the selected production tool to perform the second process step (step 48). The target electrical parameter of the resulting wafer will thus have an optimum WiW uniformity. Further, after the second process step, the wafer may be measured to obtain a second non-uniformity (step 52), which is used for evaluating the uniformity profiles of the production tools used for the second process step (step 44). One skilled in the art will realize that uniformity and non-uniformity are complementary concepts. In the above-discussed flowchart, instead of obtaining the first non-uniformity from the wafer, a first uniformity may be obtained from the wafer and used in the WiW uniformity improvement.

Figure 6:
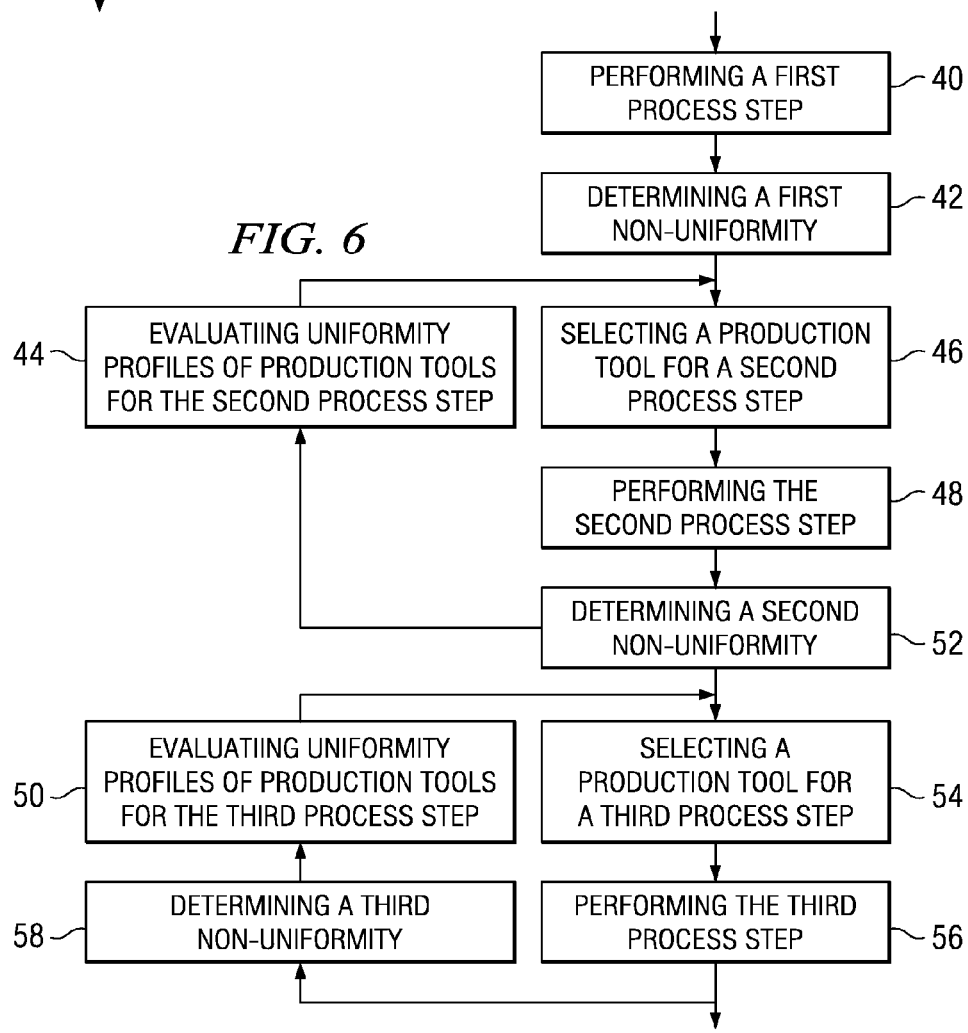
FIG. 6 illustrates a flowchart of an embodiment of the present invention, wherein an electrical parameter of a component in an integrated circuit is affected by three process steps.

The concept of the present invention may also be applied to electrical parameters of integrated circuit components formed using three or more uniformity-affecting process steps. FIG. 6 shows an exemplary flowchart comprising three uniformity-affecting process steps. In a first embodiment, the production tools for the second and the third process steps are evaluated to obtain their uniformity profiles (steps 44 and 50). Steps 40 through 48 are essentially the same as shown in FIG. 5. After the second process step is performed (step 48), the wafer is measured to obtain a second non-uniformity that will affect the target electrical parameter (52). The dispatching system then tries to dispatch the wafer to a production tool (for performing the third process step) that compensates for the second non-uniformity the best (steps 54 and 56). Similarly, after the third process steps, the wafer can be measured to obtain a third non-uniformity (step 58), from which the uniformity profiles of the production tools for the third process steps can be evaluated. In a second embodiment, the production tools for performing the second process step are not specifically selected for uniformity matching purposes, and only a production tool for performing the last process steps (the third process step in this case) is evaluated and selected for the uniformity matching purpose. Accordingly, the non-uniformity generated in all of the preceding process steps is only compensated for by the last process step.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit comprising a first process step and a second process step for forming an electrical component, wherein the electrical component has a target electrical parameter, the method comprising:
   providing a first plurality of production tools for performing the first process step;
   providing a second plurality of production tools for performing the second process step;
   providing a wafer;
   performing the first process step on the wafer using one of the first plurality of production tools;
   selecting a first route including a first production tool from the second plurality of production tools, wherein a within-wafer uniformity of the target electrical parameter on the wafer manufactured by the first route is greater than a second route including a second production tool in the second plurality of production tools; and
   performing the second process step on the wafer using the first production tool.

2. The method of claim 1, wherein the within-wafer uniformity of the target electrical parameter on the wafer manufactured by the first route is the greatest among all routes, and wherein each of the all routes comprises one of the second plurality of production tools, and the one of the first plurality of production tools.

3. The method of claim 1, wherein the step of selecting the first route comprises:
   measuring a non-uniformity of the wafer after the step of performing the first process step;
   determining uniformity profiles of the second plurality of production tools; and
   selecting a production tool from the second plurality of production tools, wherein the production tool has a uniformity profile matching the non-uniformity.

4. The method of claim 3, wherein the step of measuring the non-uniformity of the wafer comprises:

selecting a plurality of points on the wafer;
measuring dimensions of integrated circuit components at the plurality of points, wherein the within-wafer uniformity of the target electrical parameter belongs to the integrated circuit components; and
calculating the non-uniformity of the wafer from the dimensions of the integrated circuit components.

5. The method of claim 3, wherein the step of determining the uniformity profiles of the second plurality of production tools is performed periodically.

6. The method of claim 3, wherein the step of selecting the production tool from the second plurality of production tools comprises:
setting a priority list of the second plurality of production tools, wherein production tools in the priority list are arranged according to degrees of the uniformity profiles matching the non-uniformity.

7. The method of claim 6 further comprising selecting the first production tool, wherein the first production tool is behind an additional production tool having the highest priority in the priority list, and wherein the first production tool has a shorter queuing time than the additional production tool.

8. A method of forming an integrated circuit, the method comprising:
providing a wafer;
performing a first process step on the wafer;
after the first process step, determining a first non-uniformity of integrated circuit components on the wafer;
predicting uniformity profiles of a plurality of production tools for performing a second process step, wherein combinations of the first non-uniformity and the plurality of production tools affect a target electrical parameter of target components on the wafer;
selecting a production tool from the plurality of production tools according to the uniformity profiles, wherein the production tool has a uniformity profile matching the first non-uniformity;
dispatching the wafer to the production tool; and
performing the second process step using the production tool.

9. The method of claim 8, wherein the uniformity profile of the production tool matches the first non-uniformity better than remaining ones of the plurality of production tools.

10. The method of claim 8 further comprising setting a priority list of the plurality of production tools, wherein the plurality of production tools in the priority list are arranged according to degrees of the uniformity profiles for matching the first non-uniformity.

11. The method of claim 10, wherein the step of selecting the production tool from the plurality of production tools comprises:
determining queuing times of the plurality of production tools; and
selecting the production tool, wherein the production tool is not a first one in the priority list, and wherein the production tool has a shorter queue time than the first one in the priority list.

12. The method of claim 8, wherein the step of determining the first non-uniformity of the wafer comprises:
selecting a plurality of points on the wafer;
measuring dimensions of the target components at the plurality of points, wherein the dimensions of the target components affect the target electrical parameter; and
determining the first non-uniformity of the wafer from the dimensions of the target components.

13. The method of claim 8, wherein:
the target electrical parameter is a resistivity of copper lines;
the target components are copper lines;
the first non-uniformity is a non-uniformity of depths of trenches; and
the plurality of production tools are chemical mechanical polish tools.

14. The method of claim 8, wherein the step of predicting the uniformity profiles of the plurality of production tools comprises measuring wafers processed previously by the plurality of production tools.

15. The method of claim 8 further comprising:
after the second process step, determining a second non-uniformity of additional components on the wafer, wherein the additional components are formed by the second process step;
predicting additional uniformity profiles of additional production tools for performing a third process step, wherein combinations of the second non-uniformity and the additional uniformity profiles affect the uniformity of the target electrical parameter;
selecting an additional production tool from the additional production tools, wherein the additional production tool has a uniformity profile matching the second non-uniformity;
dispatching the wafer to the additional production tool; and
performing the third process step using the additional process tool.

* * * * *